(12) United States Patent
Fujioka

(10) Patent No.: US 11,715,510 B2
(45) Date of Patent: Aug. 1, 2023

(54) SEMICONDUCTOR MEMORY DEVICE HAVING CONTROL UNIT WHICH SETS THE REFRESH INTERVAL OF THE MEMORY CELL

(71) Applicant: Winbond Electronics Corp., Taichung (TW)

(72) Inventor: Shinya Fujioka, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/575,117

(22) Filed: Jan. 13, 2022

(65) Prior Publication Data
US 2022/0277786 A1    Sep. 1, 2022

(30) Foreign Application Priority Data

Feb. 26, 2021   (JP) .................................. 2021-029784

(51) Int. Cl.
*G11C 11/406*   (2006.01)
*G11C 29/42*    (2006.01)
*G11C 11/4096*  (2006.01)

(52) U.S. Cl.
CPC .... *G11C 11/40615* (2013.01); *G11C 11/4096* (2013.01); *G11C 11/40622* (2013.01); *G11C 29/42* (2013.01)

(58) Field of Classification Search
CPC ........ G11C 11/40615; G11C 11/40622; G11C 11/40696; G11C 1129/42
See application file for complete search history.

(56) References Cited

U.S. PATENT DOCUMENTS

| | | | |
|---|---|---|---|
| 6,622,197 | B1 | 9/2003 | Kim |
| 9,170,879 | B2 | 10/2015 | Yang |
| 9,336,851 | B2* | 5/2016 | Yu ......................... G11C 11/406 |
| 10,665,273 | B2* | 5/2020 | Kim ..................... G11C 7/1063 |
| 10,867,655 | B1* | 12/2020 | Harms ................ G11C 11/2273 |
| 2021/0098047 | A1 | 4/2021 | Harms et al. |
| 2023/0042731 | A1* | 2/2023 | Sasaki ................. G11C 11/406 |

FOREIGN PATENT DOCUMENTS

| | | |
|---|---|---|
| CN | 107924697 A | 4/2018 |
| JP | 2-304654 A | 12/1990 |
| JP | 4-149899 A | 5/1992 |
| JP | 2000-137995 A | 5/2000 |

(Continued)

OTHER PUBLICATIONS

Korean Office Action for Korean Application No. 10-2021-0050718, dated Mar. 30, 2022, with an English translation.

(Continued)

*Primary Examiner* — Tuan T Nguyen
(74) *Attorney, Agent, or Firm* — Birch, Stewart, Kolasch & Birch, LLP

(57) ABSTRACT

A semiconductor memory device capable of suppressing an increase in power consumption and avoiding data destruction due to the row hammer problem is provided. The semiconductor memory device includes a refresh control unit (first control unit) that sets a memory cell refresh interval based on information about a memory cell refresh interval included in a predetermined command input from the outside.

11 Claims, 8 Drawing Sheets

(56) References Cited

FOREIGN PATENT DOCUMENTS

| | | | |
|---|---|---|---|
| JP | 2008-84426 | A | 4/2008 |
| KR | 10-2001-0017413 | A | 3/2001 |
| KR | 10-2007-0048337 | A | 5/2007 |
| TW | 559696 | B | 11/2003 |
| TW | 569235 | B | 1/2004 |
| TW | 201225079 | A | 6/2012 |

OTHER PUBLICATIONS

Japanese Office Action for Japanese Application No. 2021-029784, dated Feb. 1, 2022, with English translation.

* cited by examiner

| CR0 bit | function | Setting (binary value) |
|---|---|---|
| 15 | Deep Power Down Enable | 1b: normal operation (default)<br>0b: go to deep power down mode |
| 14~12 | Drive Strength | 000b: 34Ω<br>001b: 115Ω<br>010b: 67Ω<br>011b: 46Ω<br>100b: 34Ω<br>101b: 27Ω<br>110b: 22Ω<br>111b: 19Ω |
| 11~9 | Refresh Interval | 000b: mode A<br>001b: mode B<br>010b: mode C<br>011b: mode D<br>100b~110b: reserved<br>111b: normal operation (default) |
| 8 | Reserved | 1b: reserved (default) |
| 7~4 | Initial Latency | 0000b: delay 5 clocks<br>0001b: delay 6 clocks<br>0010b: delay 7 clocks<br>0011b~1101b: reserved<br>1100b: delay 3 clocks<br>1111b: delay 4 clocks |
| 3 | Fixed Latency | 0b: variable delay<br>1b: fixed delay |
| 2 | Hybrid Burst Mode | 0b: wrap burst sequence that follows a hybrid burst sequence<br>1b: wrap burst sequence in the legacy wrap burst method |
| 1~0 | Burst Length | 00b: 128 bytes<br>01b: 64 bytes<br>10b: 16 bytes<br>11b: 32 bytes |

FIG. 3

| CR1 bit | Function | Setting (binary) |
|---|---|---|
| 15~12 | Reserved | 1b: reserved (default) |
| 11~9 | ECC applicable block control | 000b: block n-3 selected<br>    turn on /sw0、sw1、sw2、sw3<br>    turn off /sw1、/sw2、/sw3、sw0<br>001b: block n-2 selected<br>    turn on /sw1、sw0、sw2、sw3<br>    turn off /sw0、/sw2、/sw3、sw1<br>010b: block n-1 selected<br>    turn on /sw2、sw0、sw1、sw3<br>    turn off /sw0、/sw1、/sw3、sw2<br>011b: block n selected<br>    turn on /sw3、sw0、sw1、sw2<br>    turn off /sw0、/sw1、/sw2、sw3<br>100~110b: reserved<br>111b: normal operation (no block selected)<br>    turn on sw0、sw1、sw2、sw3<br>    turn off /sw0、/sw1、/sw2、/sw3 |
| 8~0 | Reserved | 1b: reserved (default) |

FIG. 5

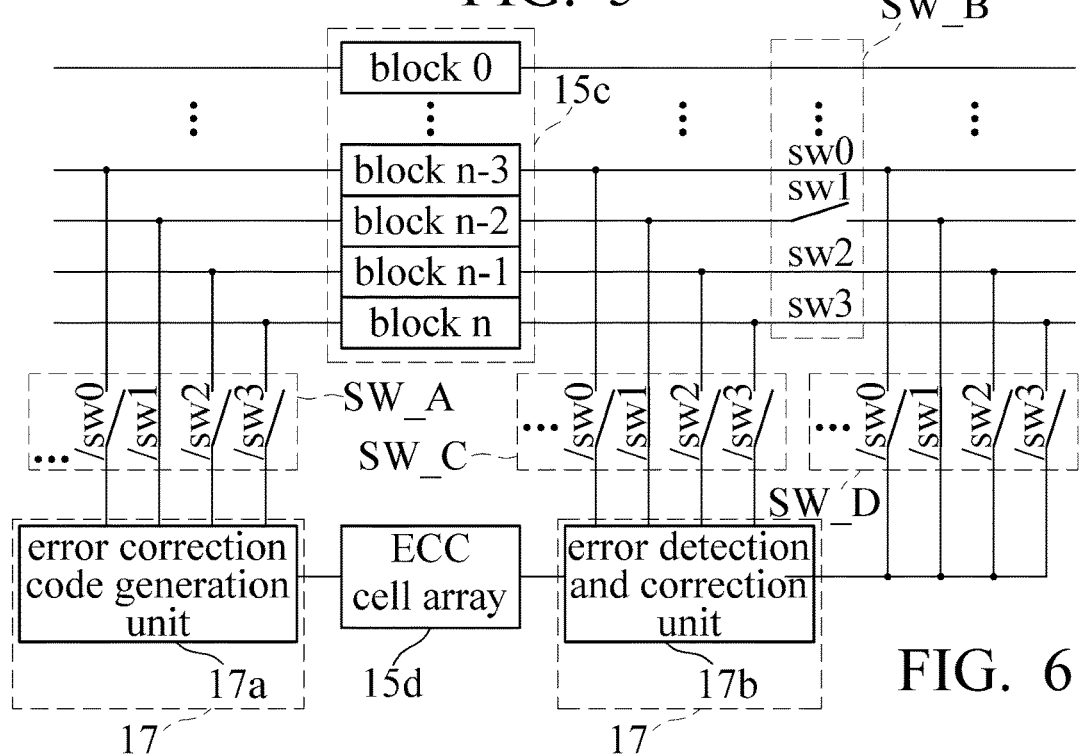

FIG. 6

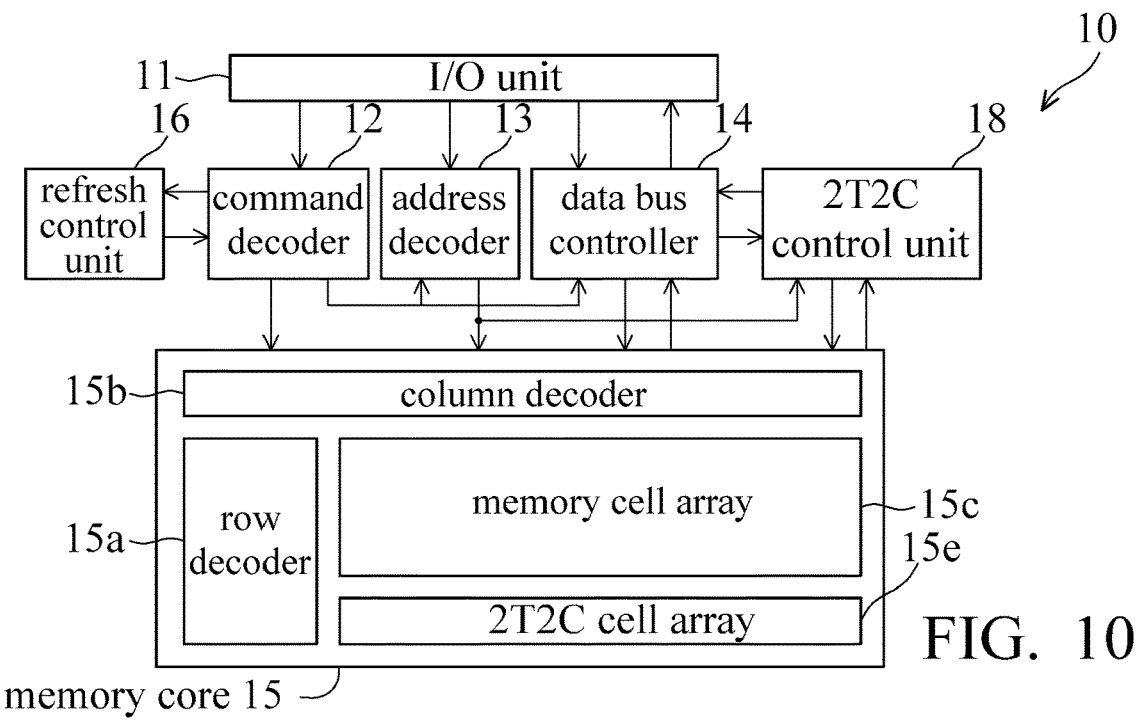

FIG. 10

| CR1 bit | Function | Setting (binary) |
|---|---|---|
| 15~12 | Reserved | 1b: reserved (default) |
| 11~9 | 2T2C applicable block control | 000b: block n-3 selected<br>　　turn on /sw0、sw1、sw2、sw3<br>　　turn off /sw1、/sw2、/sw3、sw0<br>001b: block n-2 selected<br>　　turn on /sw1、sw0、sw2、sw3<br>　　turn off /sw0、/sw2、/sw3、sw1<br>010b: block n-1 selected<br>　　turn on /sw2、sw0、sw1、sw3<br>　　turn off /sw0、/sw1、/sw3、sw2<br>011b: block n selected<br>　　turn on /sw3、sw0、sw1、sw2<br>　　turn off /sw0、/sw1、/sw2、sw3<br>100b~110b: reserved<br>111b: normal operation (no block selected)<br>　　turn on sw0、sw1、sw2、sw3<br>　　turn off /sw0、/sw1、/sw2、/sw3 |
| 8~0 | Reserved | 1b: reserved (default) |

FIG. 11

SEMICONDUCTOR MEMORY DEVICE HAVING CONTROL UNIT WHICH SETS THE REFRESH INTERVAL OF THE MEMORY CELL

CROSS REFERENCE TO RELATED APPLICATIONS

This application claims priority of Japanese Patent Application No. 2021-029784, filed on Feb. 26, 2021, the entirety of which is incorporated by reference herein.

BACKGROUND OF THE INVENTION

Field of the Invention

The present invention relates to a semiconductor memory device.

Description of the Related Art

Dynamic Random Access Memory (DRAM) is a type of semiconductor memory device, and is a volatile memory in which information is stored by storing electric charges in capacitors constituting a memory cell. When power is not supplied, the stored information is lost. Since the electric charge stored in the capacitor will be discharged after a certain period, periodically performing memory retention operation so-called charge refreshing is necessary for DRAM.

Moreover, if too many read and/or write requests are concentrated on the same row address before the next refresh, row hammer problem may occur. The row hammer problem is a problem that the charge of the data bit corresponding to the row address physically adjacent to the row address is discharged when too many accesses are concentrated on the same row address within a certain period, which causing a data corruption problem.

FIG. 1 shows an example of the relationship between the aspect of read/write request to the semiconductor memory device and the refresh interval. In the example shown in FIG. 1, it is assumed that a refresh is performed every time a certain period (interval I1) elapses. As shown in FIG. 1 (a), data retention will not be impaired when read/write access is not frequently requested. However, as shown in FIG. 1 (b), when read/write access is frequently requested, data retention will be impaired (in other words, the charge of the data bit will be discharged), and the data retention time will become shorter, which can lead to data corruption.

In order to solve the row hammer problem, for example, it is conceivable to always set the refresh interval (I1) of the memory cell short. However, in this case, there is an apprehension that the power consumption of the semiconductor memory device will increase since refreshing is frequently performed at short intervals.

In view of the above problems, the present invention is made to provide a semiconductor memory device capable of avoiding data destruction due to the row hammer problem and suppressing an increase in power consumption.

BRIEF SUMMARY OF THE INVENTION

The present invention provides a semiconductor memory device, comprising a first control unit, which sets the refresh interval of the memory cell based on information related to the refresh interval of the memory cell included in a predetermined command input from the outside.

The semiconductor memory device is possible to suppress an increase in power consumption and avoid data destruction due to the row hammer problem.

BRIEF DESCRIPTION OF THE DRAWINGS

FIG. 3 is a diagram showing a configuration example of a first configuration register.

FIG. 5 is a diagram showing a configuration example of a second configuration register.

FIG. 6 is a diagram illustrating an example of data control in the semiconductor memory device of the present embodiment.

FIG. 10 is a diagram showing a configuration example of a semiconductor memory device according to a third embodiment of the present invention.

FIG. 11 is a diagram showing a configuration example of a second configuration register.

DETAILED DESCRIPTION OF THE INVENTION

Figure 1:
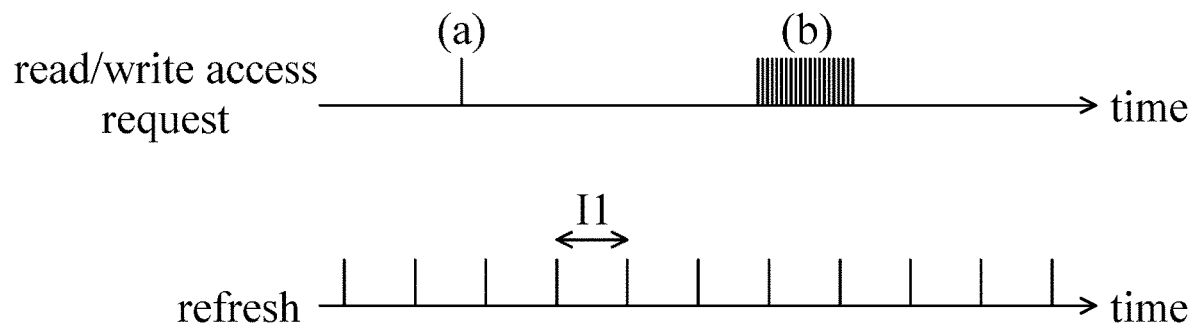
FIG. 1 shows an example of the relationship between a mode of read/write access request for a conventional semiconductor memory device and a refresh interval.
Figure 2:
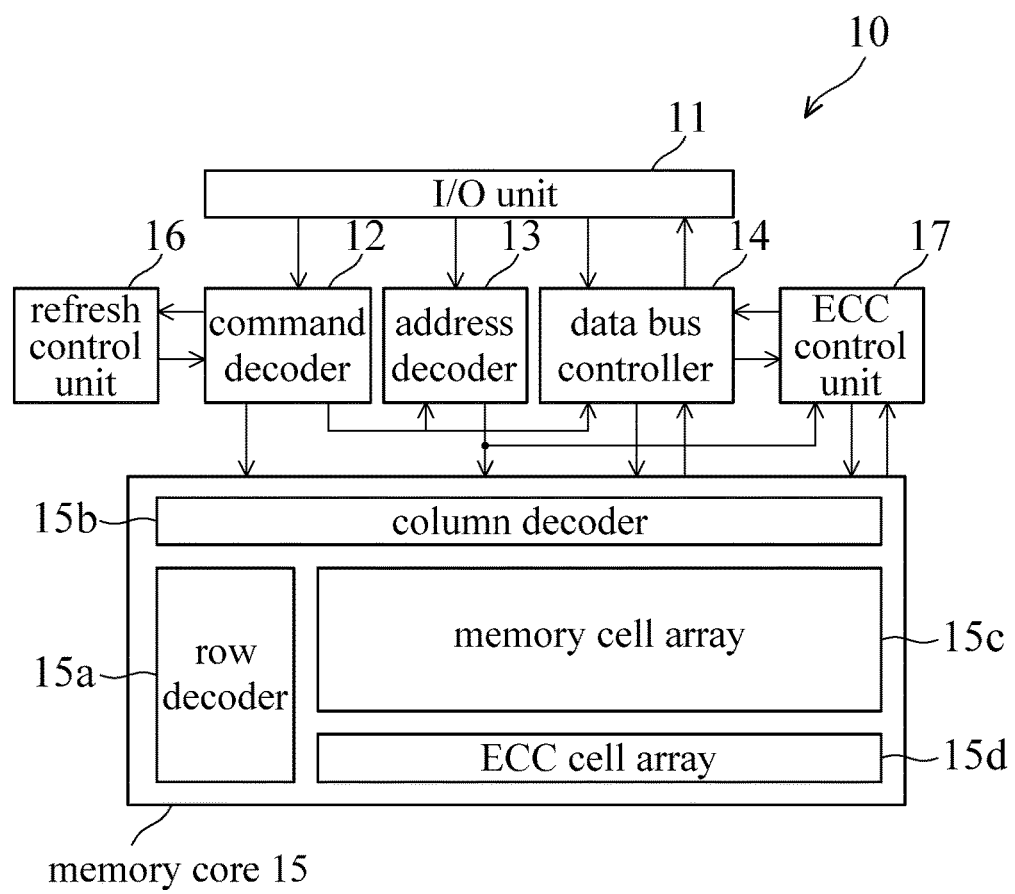
FIG. 2 is a block diagram showing a configuration example of a semiconductor memory device according to the first embodiment of the present invention.

Referring to FIG. 2, the semiconductor memory device 10 includes an I/O (input/output) unit 11, a command decoder 12, an address decoder 13, a data bus controller 14, a memory core 15, a refresh control unit 16, and an ECC (Error-Correcting Code) control unit 17. The units 11~17 in the semiconductor memory device 10 can be configured by a dedicated hardware device or a logic circuit. Besides, for simplicity, other well-known configurations such as a power supply circuit or a clock generator are not shown in this embodiment.

The semiconductor memory device according to the present embodiment can be a DRAM or a pSRAM (pseudo-Static Random Access Memory) configured to internally control a refresh operation. For example, in the conventional DRAM, a dedicated circuit configured to solve the row hammer problem by registering a disturb word line address, and data is recovered by an additional refresh operation. However, since pSRAM is becoming smaller, it is difficult to reserve a space for setting up a dedicated circuit. Furthermore, if such a dedicated circuit is provided in the pSRAM, the cost of the pSRAM may increase.

Therefore, when the semiconductor memory device according to the present embodiment is pSRAM, it is possible to suppress an increase in power consumption and avoid data destruction caused by the row hammer problem at the same time without providing a dedicated circuit, which is preferred.

The I/O unit 11 is configured to transmit and receive signals to and from an external device (for example, a memory controller and so on). Specifically, I/O unit 11 outputs the command signal that is input from an external device to the command decoder 12. In addition, I/O unit 11 outputs the address signal that is input from the external device to the address decoder 13. Furthermore, I/O unit 11 outputs the data signal (hereinafter referred to as "data") that is input from the external device to the data bus controller 14, and outputs the data that is output from the data bus controller 14 to the external device.

The command decoder 12 decodes a command signal input from the outside via the I/O unit 11 and generates an internal command. Here, the generated internal command, for example, includes an active signal, a read signal, a write signal, a pre-charge signal and so on. Furthermore, when the command decoder 12 generates an internal command, it outputs a signal, which is used for activating a word line that becomes a target for read/write access or refreshing, to the row decoder 15*a* of the memory core 15 (it will be described later). Furthermore, when the command decoder 12 generates an internal command, it outputs a signal, which is used for activating a bit line that becomes a target for read/write access or refreshing, to the column decoder 15*b* of the memory core 15 (it will be described later). Furthermore, the command decoder 12 can also output the generated internal command to the address decoder 13 and the data bus controller 14, and control each of the address decoder 13 and the data bus controller 14 based on the internal command.

In addition, when a register write command (predetermined command) for setting the function of the semiconductor memory device 10 is input from an external device via the I/O unit 11, and when the first configuration register information (shown in FIG. 3) indicating the setting contents of the first configuration register is included in the register write command, the command decoder 12 stores the first configuration register information in the first configuration register (not shown in the figure). Furthermore, when a register write command including the first configuration register information is input, the command decoder 12 output the register write command to the refresh control unit 16. Furthermore, each time the high-level refresh signal srefz (shown in FIG. 4) is input from the refresh control unit 16, the command decoder 12 outputs a signal, which indicates the address of the memory cell to be refreshed, to the address decoder 13.

FIG. 3 shows an example that the first configuration register (CR0) of the pSRAM using the HyperBus™ interface. As shown in FIG. 3, the first configuration register is used to define the power mode of the semiconductor memory device 10 or the operating conditions of the access protocol and so on, and is configured so that several functions (which are "Deep Power Down Enable", "Drive Strength", "Refresh Interval", "Initial Latency", "Fixed Latency", "Hybrid Burst Mode", "Burst Length" in this example) assigned within a predetermined number of bits (16 bits in this example) can be specified externally. Since the functions other than the "refresh interval" shown in FIG. 3 are not particularly related to the present invention, detailed description thereof will be omitted.

In the present embodiment, the refresh interval can be specified in bits 11 to 9 of the first configuration register. In the example shown in FIG. 3, one of a plurality of modes (four in this example, which are "Mode A", "Mode B", "Mode C", and "Mode D") according to the values of bits 11 to 9 of the first configuration register or a normal operation (default) mode can be specified. Here, each mode is an example of "information related to the refresh interval" in the present invention. In the example shown in FIG. 3, Mode A is specified when the value of bits 11 to 9 of the first configuration register is 000b, Mode B is specified when the value of bits 11 to 9 of the first configuration register is 001b, Mode C is specified when the value of bits 11 to 9 of the first configuration register is 010b, Mode D is specified when the value of bits 11 to 9 of the first configuration register is 011b, and the normal operation mode is specified when the value of bits 11 to 9 of the first configuration register is 111b. The refresh interval of each mode is different from each other. In this embodiment, the refresh interval is configured to be shorter in the order of the normal operation mode, Mode A, Mode B, Mode C, and Mode D.

For example, the contents of the first configuration register shown in FIG. 3 can be written to the first configuration register in the semiconductor memory device 10 by the register write command including the first configuration register information being input from the external device when the power of the semiconductor memory device 10 is turned on. In addition, the register write command including the first configuration register information can be input at an arbitrary timing while the power is turned on to the semiconductor memory device 10.

Returning to FIG. 2, the address decoder 13 decodes the address signal input from the outside via the I/O unit 11 or the signal indicating the address of the memory cell to be refreshed input from the command decoder 12, and generates a row address signal indicating an activated word line among a plurality of word lines in the memory cell array 15*c* of the memory core 15. Then, the address decoder 13 outputs the generated row address signal to the row decoder 15*a* of the memory core 15.

Furthermore, the address decoder 13 decodes an address signal input from the outside via the I/O unit 11 and generates a column address signal indicating the activated bit line among the plurality of bit lines in the memory cell array 15*c* of the memory core 15. Then, the address decoder 13 outputs the generated column address signal to the column decoder 15*b* of the memory core 15.

The data bus controller 14 outputs data input from the outside via the I/O unit 11 to the sense amplifier (not shown in the figure) of the memory core 15 and the ECC control unit 17. Furthermore, the data bus controller 14 outputs the data output from the sense amplifier of the memory core 15 or the ECC control unit 17 to the I/O unit 11.

The memory core 15 includes a row decoder 15*a*, a column decoder 15*b*, a memory cell array 15*c*, an ECC cell array 15*d*, and a sense amplifier (not shown in the figure).

The row decoder 15*a* activates (drives) the word line indicated by the row address signal output from the address decoder 13 among a plurality of word lines in the memory cell array 15*c* when a signal for activating a word line that becomes a target for read/write access or refreshing is input from the command decoder 12.

The column decoder 15*b* activates (drives) the bit line indicated by the column address signal output from the address decoder 13 among a plurality of bit lines in the memory cell array 15*c* when a signal for activating a bit line that becomes a target for read/write access or refreshing is input from the command decoder 12.

The memory cell array 15*c* includes a plurality of memory cells (not shown in the figure) arranged in a matrix (array) form. Data input from the outside is stored in each memory cell via the I/O unit 11. Each memory cell may be a well-known 1T1C (1-transistor 1-capacitor) memory cell. Furthermore, each memory cell is connected to any one of the plurality of word lines and any one of the plurality of bit lines. Furthermore, each of the word lines is connected to the row decoder 15a, and each of the bit lines is connected to the column decoder 15b and the sense amplifier.

Like the memory cell array 15c, the ECC cell array 15d includes a plurality of memory cells (not shown in the figure) arranged in the form of an array. Inspection data (parity data) output from the ECC control unit 17 is stored in each memory cell. Each memory cell may be a 1T1C memory cell. Furthermore, each memory cell is connected to any one of the plurality of word lines and any one of the plurality of bit lines. Furthermore, each of the word lines is connected to the row decoder 15a, and each of the bit lines is connected to the column decoder 15b and the sense amplifier.

Since the details of data control for each memory cell of the memory cell array 15c and the ECC cell array 15d are well-known techniques, the description thereof will be omitted herein.

The refresh control unit 16 generates a refresh signal srefz and outputs it to the command decoder 12. Here, the refresh control unit 16 is configured to set the refresh interval of the memory cells based on the information related to the refresh interval of the memory cells included in the register write command when the register write command (predetermined command) including the first configuration register information is input from the command decoder 12. The refresh control unit 16 is an example of the "first control unit" in the present invention.

In addition, the refresh control unit 16 may set the refresh interval of the memory cells based on the information related to the refresh interval of the memory cells included in the register write command every time when the register write command (predetermined command) including the first configuration register information is input from the outside.

Figure 4A:
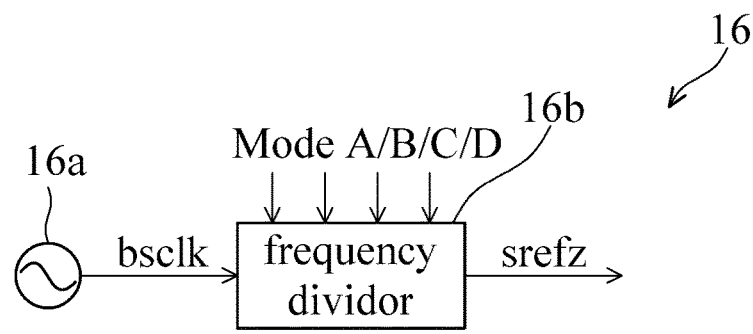
FIG. 4(a) shows a configuration example of a refresh control unit.

Referring to FIG. 4, an example of the configuration and operation of the refresh control unit 16 is described. As shown in FIG. 4(a), the refresh control unit 16 includes an oscillation circuit 16a and a frequency divider 16b. The oscillation circuit 16a generates a refresh trigger signal bsclk for starting the refresh operation at a predetermined frequency and outputs it to the frequency divider 16b.

The frequency divider 16b performs frequency division to the refresh trigger signal bsclk output from the oscillation circuit 16a according to the refresh interval (which is one of Mode A, Mode B, Mode C, and Mode D herein) of the memory cell included in the register write command. Then, the frequency divider 16b outputs the divided signal as a refresh signal srefz to the command decoder 12. Note that the description of the normal operation mode is omitted here.

Figure 4B:
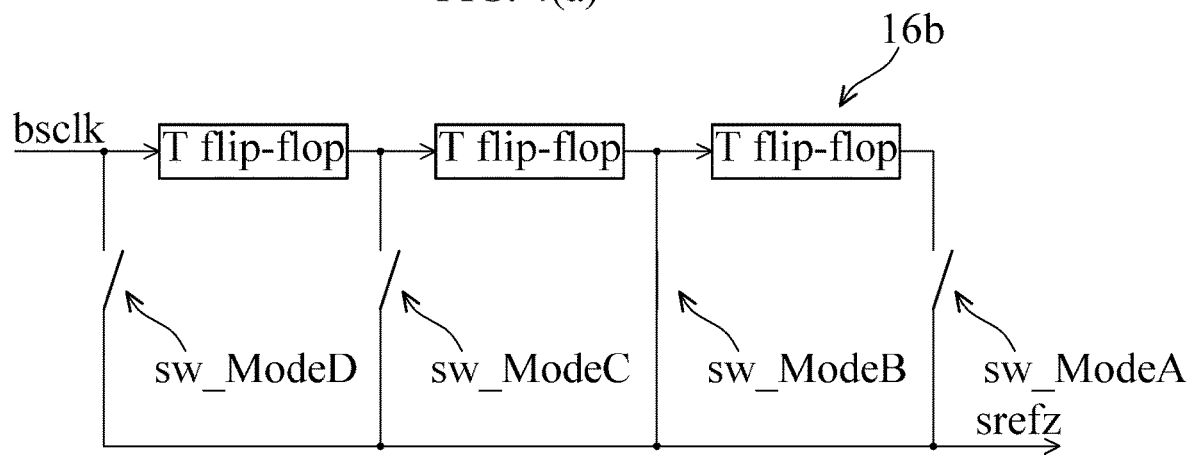
FIG. 4(b) shows a configuration example of a frequency divider.
Figure 4C:
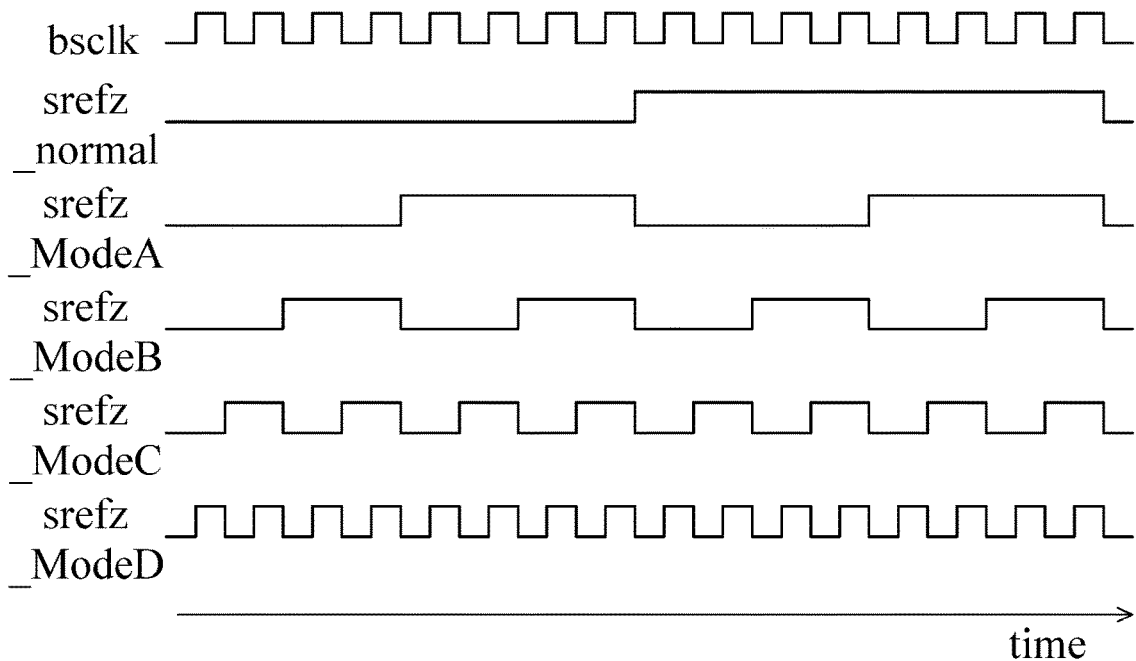
FIG. 4(c) is a time chart showing refresh request signals for each of a plurality of modes.

A configuration example of the frequency divider 16b is shown in FIG. 4 (b). As shown in FIG. 4B, the frequency divider 16b includes three T flip-flops connected in series and four switches sw_ModeA, sw_ModeB, sw_ModeC, and sw_ModeD.

The refresh trigger signal bsclk output from the oscillation circuit 16a is input to the T flip-flop at the first stage (first stage flip-flop) among the three T flip-flops and one end side of the switch sw_ModeD corresponding to Mode D among the four modes. When the switch sw_ModeD is turned on, the refresh trigger signal bsclk will be output as a refresh signal srefz.

The signal output from the first stage T flip-flop is input to the T flip-flop at the second stage (second stage flip-flop) among the three T flip-flops and one end side of the switch sw_ModeC corresponding to Mode C among the four modes. When the switch sw_ModeC is turned on, the signal output from the first stage T flip-flop will be output as a refresh signal srefz.

The signal output from the second stage T flip-flop is input to the T flip-flop at the third stage (third stage flip-flop) among the three T flip-flops and one end side of the switch sw_ModeB corresponding to Mode B among the four modes. When the switch sw_ModeB is turned on, the signal output from the second stage T flip-flop will be output as a refresh signal srefz.

The signal output from the third stage T flip-flop is input to one end side of the switch sw_ModeA corresponding to Mode A among the four modes. When the switch sw_ModeA is turned on, the signal output from the third stage T flip-flop will be output as a refresh signal srefz.

Based on the configuration mentioned above, as shown in FIG. 4(c), the frequency of the refresh signal srefz increases in the order of Mode A, Mode B, Mode C, and Mode D (which means that the refresh interval becomes shorter in the order of Mode A, Mode B, Mode C, and Mode D).

According to the refresh interval of the memory cell included in the register write command, the refresh control unit 16 controls only one of the switches sw_ModeA, sw_ModeB, sw_ModeC, and sw_ModeD of the frequency divider 16b to be turned on, and the other switches to be turned off. For example, when the refresh interval of the memory cell included in the register write command is Mode A, the switch sw_ModeA is controlled to be turned on, and the other switches sw_ModeB, sw_ModeC, and sw_ModeD are controlled to be turned off.

The ECC control unit 17 generates an error correction code (encoded data) corresponding to the data output (stored) from the data bus controller 14 to the memory cell array 15c, and stores the inspection data (parity data) in the ECC cell array 15d. Furthermore, when the data for which the error correction code is generated is output (read) from the memory cell array 15c, the ECC control unit 17 uses the inspection data stored in the ECC cell array 15d to perform error detection and correction processing for the data. Then, the ECC control unit 17 outputs the data after the error detection and correction processing to the data bus controller 14.

Furthermore, as shown in FIG. 6, the ECC control unit 17 includes: an error correction code generation unit 17a that generates an error correction code (encoded data) corresponding to the data stored in the memory cell array 15c, and an error detection and correction unit 17b that performs error detection and correction processing for the data when the data for which the error correction code is generated is read from the memory cell array 15c.

Here, for example, generating the error correction code and the error correction process may be performed by a well-known method like a Hamming code or a BCH (Bose-Chaudhuri-Hocquenghem) code and so on. Furthermore, the length of the source data of the coded data and the length of the inspection data may be arbitrarily selected. Here, as an example to elaborate, the length of the source data of the coded data is 8 bits, and the inspection data is 4 bits performed. Furthermore, in this case, 1-bit error correction is performed among the 8-bit data.

In the present embodiment, when the memory cell array 15c including a plurality of memory cells arranged in an array (matrix) form is divided into a plurality of blocks, the ECC control unit 17 is configured to select a block of any of a plurality of blocks. Furthermore, the ECC control unit 17 stores the inspection data in the error correction code, which is generated according to the data stored in the plurality of memory cells, in the selected block in the ECC cell array 15d (predetermined memory area). The ECC control unit 17 is an example of the "second control unit" in the present invention.

In addition, when the register write command (predetermined command) including the second configuration register information (shown in FIG. 5) is input from the outside, the ECC control unit 17 may select any one of the plurality of blocks based on the information of the selected block included in the register write command. As a result, when a register write command (predetermined command) is input from the outside, one of a plurality of blocks is selected based on the information about the selected block included in the command. Therefore, by transmitting this command from an external device (for example, a memory controller or the like) to the semiconductor memory device 10, any block among a plurality of blocks (a block where data for which an error correction code is generated is stored) may be set (selected) from the outside.

Here, when a block is selected based on the information related to the selected block included in the register write command, and when input a register write command (predetermined command) including the second configuration register information is input from the external device via the I/O unit 11, the command decoder 12 stores the second configuration register information in the second configuration register (not shown in the figure). Furthermore, the command decoder 12 outputs the register write command to the ECC control unit 17 when the register write command including the second configuration register information is input.

Referring to FIG. 5, a configuration example of the second configuration register is described. FIG. 5 shows an example of the second configuration register (CR1) of the pSRAM using the HyperBus™ interface. As shown in FIG. 5, the second configuration register is configured to assign a function (which is "ECC applicable block control" in this example) within a predetermined number of bits (16 bits in this example).

In the present embodiment, bits 11 to 9 of the second configuration register are configured so that an ECC applicable block (which is a block where data for which an error correction code is generated is stored) can be assigned (selected).

In the example shown in FIG. 5, any one of the plurality of blocks (four in the example of the figure) may be selected depending on the value of bits 11 to 9 of the second configuration register. Here, each block shown in FIG. 5 is an example of "information related to the selected block" in the present invention. In the example shown in FIG. 5, when the value of bits 11 to 9 of the second configuration register is 000b, block n−3 (n is an integer not less than 3) is selected. When the value of bits 11 to 9 of the second configuration register is 001b, block n−2 is selected. When the value of bits 11 to 9 of the second configuration register is 010b, block n−1 is selected. When the value of bits 11 to 9 of the second configuration register is 011b, block n is selected. Furthermore, when the value of bits 11 to 9 of the second configuration register is 111b, the normal operation mode (no selection block, that is, no block is selected) is assigned.

For example, the contents of the second configuration register shown in FIG. 5 can also be written to the second configuration register in the semiconductor memory device 10 by inputting a register write command including the second configuration register information from an external device when the power is turned on to the semiconductor memory device 10. Furthermore, the register write command including the second configuration register information may be input at an arbitrary timing while the power is turned on to the semiconductor memory device 10.

Furthermore, in the example shown in FIG. 5, in each of the blocks and the normal operation mode, the on/off state of a plurality of switches (sw0, sw1, sw2, sw3, /sw0, /sw1, /sw2, /sw3 in this example) are shown. It will be described with reference to FIG. 6.

As shown in FIG. 6, the memory cell array 15c is divided into a plurality of blocks (block 0, . . . , block n−3, block n−2, block n−1, block n in this example) having consecutive row addresses. The memory capacity of the data in each block may be the same or different. For example, when the memory capacity of the memory cell array 15c is 64M bits and the memory capacity of each block is 2M bits, the memory cell array 15c is divided into 32 blocks. In addition, in this case, when the length of the source data of the coded data is 8 bits and the length of the inspection data is 4 bits, the memory capacity of the ECC cell array 15d is 1 Mbit.

First, a case where data is stored in the memory cell array 15c will be described. The data output from the data bus controller 14 is input to the input side of each block of the memory cell array 15c. Furthermore, the data input to the selected block (which is block n−2 in this example) among the blocks is also input to the error correction code generation unit 17a of the ECC control unit 17 via the switch unit SW_A. Here, the ECC control unit 17 may select a block (block n−2 herein) based on the information related to the selected block included in the register write command. Furthermore, the ECC control unit 17 can also control switch unit SW_A so that when data is input to the selected block among each block (block n−2 herein), the data is input to the error correction code generation unit 17a.

For example, when the block n−2 is selected in the register write command, the ECC control unit 17 controls each switch in the switch unit SW_A according to the on/off state of each switch corresponding to the block n−2. Here, in the example shown in FIG. 6, four switches/sw0, /sw1, /sw2, /sw3 are provided in the switch unit SW_A. One end side of the switch/sw0 of the switch unit SW_A is connected to the input side of the block n−3, and the other end side of the switch/sw0 is connected to the error correction code generation unit 17a. One end side of the switch/sw1 of the switch unit SW_A is connected to the input side of the block n−2, and the other end side of the switch/sw1 is connected to the error correction code generation unit 17a. One end side of the switch/sw2 of the switch unit SW_A is connected to the input side of the block n−1, and the other end side of the switch/sw2 is connected to the error correction code generation unit 17a. One end side of the switch/sw3 of the switch unit SW_A is connected to the input side of the block n, and the other end side of the switch/sw3 is connected to the error correction code generation unit 17a.

Furthermore, in the example shown in FIG. 5, when the block n−2 is selected, the switch/sw1 is set to be turned on and the switches/sw0, /sw2, and/sw3 are set to be turned off. In this case, the ECC control unit 17 controls the switch/sw1 of the switch unit SW_A to be turned on, and controls the switches/sw0, /sw2, /sw3 of the switch unit SW_A to be turned off. As a result, the data input to the block n−2 of the memory cell array 15c is also input to the error correction code generation unit 17a of the ECC control unit 17 via the switch unit SW_A.

In addition, when the data is input to the selected block (block n−2 herein) via the switch/sw1 of the switch unit SW_A, the error correction code generation unit 17a of the ECC control unit 17 generates an error correction code (coded data) corresponding to the data and stores the inspection data in the generated error correction code in the ECC cell array 15d.

Next, a case where data is output from the memory cell array 15c will be described. The data output from blocks other than the selected block (block n−2 herein) among the blocks of the memory cell array 15c is input to the data bus controller 14 via the switch unit SW_B. Furthermore, the data output from the selected block (block n−2 herein) among the blocks will not be input to the data bus controller 14 via the switch unit SW_B, but input to the error detection and correction unit 17b of the ECC control unit 17 via the switch unit SW_C.

Here, when the data is output from the selected block (block n−2 herein) among each block, the ECC control unit 17 may input the data to the error detection and correction unit 17b of the ECC control unit 17 to control the switch units SW_B and SW_C. For example, when the block n−2 is selected in the register write command, the ECC control unit 17 controls each switch of the switch unit SW_B and the switch unit SW_C according to the on/off state of each switch corresponding to the block n−2. Here, in the example shown in FIG. 6, four switches sw0, sw1, sw2, and sw3 are provided in the switch unit SW_B. One end side of the switch sw0 of the switch unit SW_B is connected to the output side of the block n−3, and the other end side of the switch sw0 is connected to the data bus controller 14. One end side of the switch sw1 of the switch unit SW_B is connected to the output side of the block n−2, and the other end side of the switch sw1 is connected to the data bus controller 14. One end side of the switch sw2 of the switch unit SW_B is connected to the output side of the block n−1, and the other end side of the switch sw2 is connected to the data bus controller 14. One end side of the switch sw3 of the switch unit SW_B is connected to the output side of the block n, and the other end side of the switch sw3 is connected to the data bus controller 14.

Furthermore, in the example shown in FIG. 6, four switches/sw0, /sw1, /sw2, /sw3 are provided in the switch unit SW_C. One end side of the switch/sw0 of the switch unit SW_C is connected between the output side of the block n−3 and the switch sw0 of the switch unit SW_B, and the other end of the switch/sw0 is connected to the error detection and correction unit 17b. One end side of the switch/sw1 of the switch unit SWC is connected between the output side of the block n−2 and the switch sw1 of the switch unit SW_B, the other end side of the switch/sw1 is connected to the error detection and correction unit 17b. One end side of the switch/sw2 of the switch unit SW_C is connected between the output side of the block n−1 and the switch sw2 of the switch unit SW_B, the other end side of the switch/sw2 is connected to the error detection and correction section 17b. One end side of the switch/sw3 of the switch unit SW_C is connected between the output side of the block n and the switch sw3 of the switch unit SW_B, the other end side of the switch/sw3 is connected to the error detection and correction section 17b.

Specifically, in FIG. 5, when the block n−2 is selected, switches/sw1, sw0, sw2, sw3 is set to be turned on, and switches/sw0, /sw2, /sw3, /sw1 is set to be turned off In this case, the ECC control unit 17 controls switches sw0, sw2, and sw3 of the switch unit SW_B to be turned on, and controls the switch sw1 of the switch unit SW_B to be turned off. Furthermore, the ECC control unit 17 controls the switch/sw1 of the switch unit SW_C to be turned on, and controls switches/sw0, /sw2, /sw3 to be turned off. As a result, the data output from the block n−2 of the memory cell array 15c can be input to the error detection and correction unit 17b of the ECC control unit 17 via the switch unit SW_C.

The error detection and correction unit 17b of the ECC control unit 17 uses the inspection data stored in the ECC cell array 15d to perform error detection and correction processing for the input data when the data output from the selected block (block n−2 herein) is input via the switch/sw1 of the switch unit SW_C.

Then, the ECC control unit 17 can also control the switch unit SW_D, output the data after the error detection and correction processing are performed to the data bus controller 14. Here, the ECC control unit 17 outputs the data after the error detection and correction processing to the data bus controller 14 as the data output from the selected block (block n−2 herein) among each block. As such, the switch unit SW_D may be controlled.

For example, when the block n−2 is selected in the register write command, the ECC control unit 17 controls each switch of the switch unit SW_D according to the on/off state of each switch corresponding to the block n−2. Here, in the example shown in FIG. 6, four switches/sw0, /sw1, /sw2, /sw3 are provided in the switch unit SW_D. One end side of the switch/sw0 of the switch unit SW_D is connected between the switch sw0 of the switch unit SW_B and the data bus controller 14, and the other end of the switch/sw0 is connected to the error detection and correction unit 17b. One end side of the switch/sw1 of the switch unit SW_D is connected between the switch sw1 of the sw1 of the switch unit SW_B and the data bus controller 14, the other end of the switch/sw1 is connected to the error detection and correction unit 17b. One end side of the switch/sw2 of the switch unit SW_D is connected between the switch sw2 of the switch unit SW_B and the data bus controller 14, the other end of the switch/sw2 is connected to the error detection and correction unit 17b. One end side of the switch/sw3 of the switch unit SW_D is connected between the switch sw3 of the switch unit SW_B and the data bus controller 14, and the other end of the switch/sw3 is connected to the error detection and correction section 17b.

In addition, in the example shown in FIG. 5, when the block n−2 is selected, the switch/sw1 is set to be turned on and switches/sw0, /sw2, and/sw3 are set to be turned off. In this case, the ECC control unit 17 controls the switch/sw1 of the switch unit SW_D to be turned on, and controls switches/sw0, /sw2, /sw3 of the switch unit SW_D to be turned off. As a result, the data output from the error detection and correction unit 17b is input to the data bus controller 14 via the switch/sw1 of the switch unit SW_D.

Figure 7:
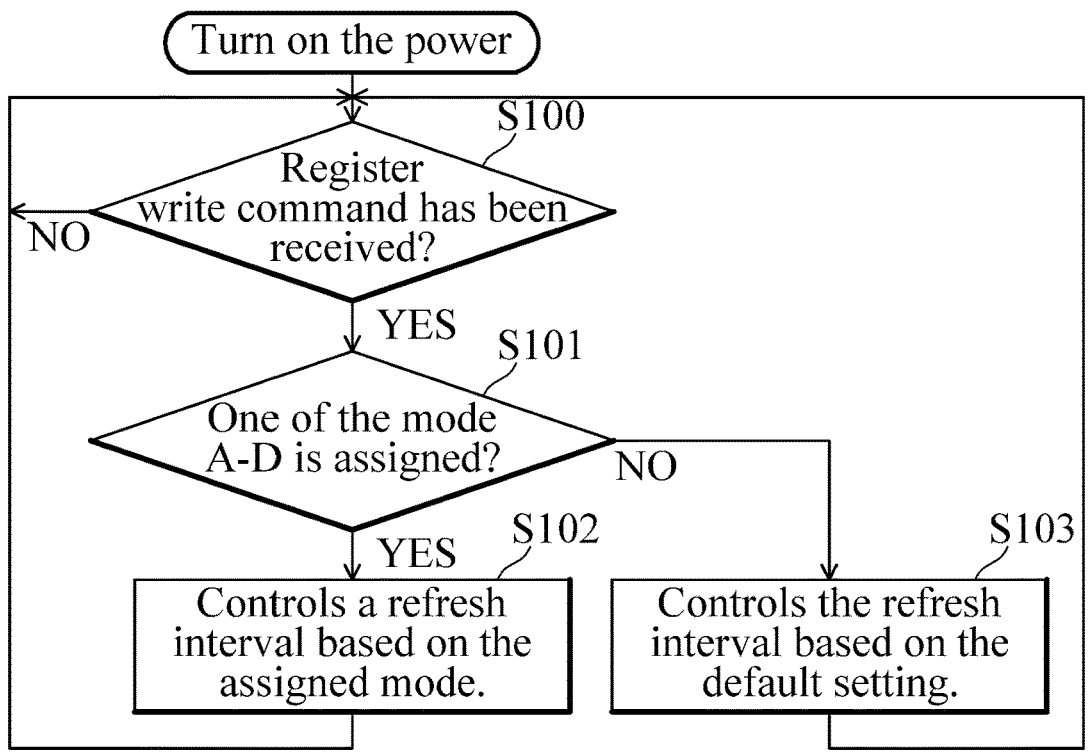
FIG. 7 is a flowchart showing an example of processing of a semiconductor memory device when a refresh interval is set.

Next, referring to FIG. 7, an example of the operation of the semiconductor memory device 10 according to the present embodiment will be described. When the power is turned on to the semiconductor memory device 10, the semiconductor memory device 10 determines whether a register write command including the first configuration register information has been received or not (step S100). Specifically, the command decoder 12 determines whether the register write command has been input from an external device via the I/O unit 11.

When the semiconductor memory device 10 had already received the register write command (step S100: YES), the semiconductor memory device 10 determines whether the register write command assigns one of four modes (Mode A, Mode B, Mode C, Mode D) in the register write command (step S101). Specifically, the command decoder 12 outputs the register write command which is input to the refresh control unit 16. On the other hand, the refresh control unit 16 determines whether a mode is assigned based on the refresh interval included in the register write command which is input.

Next, when any of the four modes (Mode A, Mode B, Mode C, Mode D) is assigned (step S101: YES), the semiconductor memory device 10 controls a refresh interval based on the assigned mode (step S102). Specifically, the refresh control unit 16 generates a refresh signal srefz corresponding to the assigned mode and outputs it to the command decoder 12. Then, the semiconductor memory device 10 returns to step S100.

Furthermore, the semiconductor memory device 10 controls the refresh interval based on the default setting (step S103) when none of the four modes (Mode A, Mode B, Mode C, Mode D) is assigned (step S101: NO). Specifically, the refresh control unit 16 generates a refresh signal srefz corresponding to the normal operation mode and outputs it to the command decoder 12. Then, the semiconductor memory device 10 returns to step S100.

In addition, the semiconductor memory device 10 may return to step S100 when the register write command has not been received in the process of step S100 (step S100: NO).

As described above, according to the semiconductor memory device 10 of the present embodiment, when the register write command (predetermined command) is input from the outside, since the refresh interval of the memory cell is set based on the information related to the refresh interval included in the register write command, each time the register write command is input from the outside, the memory cell refresh interval of the memory cell can be set from the outside by transmitting the register write command from the external device (such as memory controller and so on) to the semiconductor memory device 10. In this way, since the refresh interval of the memory cell can be set arbitrarily, the increase in power consumption can be suppressed (compared with cases where the refresh interval of the memory cell is always set short) and data corruption due to the row hammer problem can be avoided.

Furthermore, the register write command (predetermined command) is configured as a command for setting the function of the semiconductor memory device 10. As a result, it is possible to set the refresh interval of the memory cell at the timing of setting the function of the semiconductor memory device (for example, when the power is turned on).

In addition, the refresh control unit 16 (the first control unit) is configured to set the memory cell refresh interval based on the information related to the memory cell refresh interval included in the register write command (predetermined command) each time the register write command is input from the outside. By doing so, the refresh interval of the memory cell can be set each time when the register write command is input from the outside. Therefore, the refresh interval of the memory cell can be changed appropriately.

Furthermore, the semiconductor memory device 10 according to the present embodiment includes an ECC control unit 17 (a second control unit). When the memory cell array 15c includes a plurality of memory cells that are arranged in an array is divided into a plurality of blocks, the ECC control unit 17 selects one of the blocks and stores the error correction code in the ECC cell array 15d (predetermined memory area). The error correction code is generated according to the data stored in a plurality of memory cells in the selected block. Since it possible to generate an error correction code only for the data stored in the block selected from the plurality of blocks in the memory cell array 15c, the retention characteristics of the data stored in the selected block can be enhanced. Furthermore, compared with cases where an error correction code is generated for all the data stored in the memory cell array 15c, it is possible to suppress an increase in the scale of the circuit being used for storing the inspection data, and so on. Therefore, area penalties can be reduced.

Furthermore, the area (predetermined memory area) in which the inspection data is stored is configured to be an ECC cell array 15d (another memory cell array) different from the memory cell array 15c. As a result, since the inspection data in the error correction code can be stored in the ECC cell array 15d which is different from the memory cell array 15c where the data is stored, it is possible to suppress the decrease in memory capacity by storing the inspection data in the same memory cell.

Hereinafter, the second embodiment of the present invention will be described. The semiconductor memory device 10 of the present embodiment is different from the first embodiment in that the ECC cell array 15d is provided in the memory cell array 15c. Hereinafter, the configuration different from the first embodiment will be described.

Figure 8:
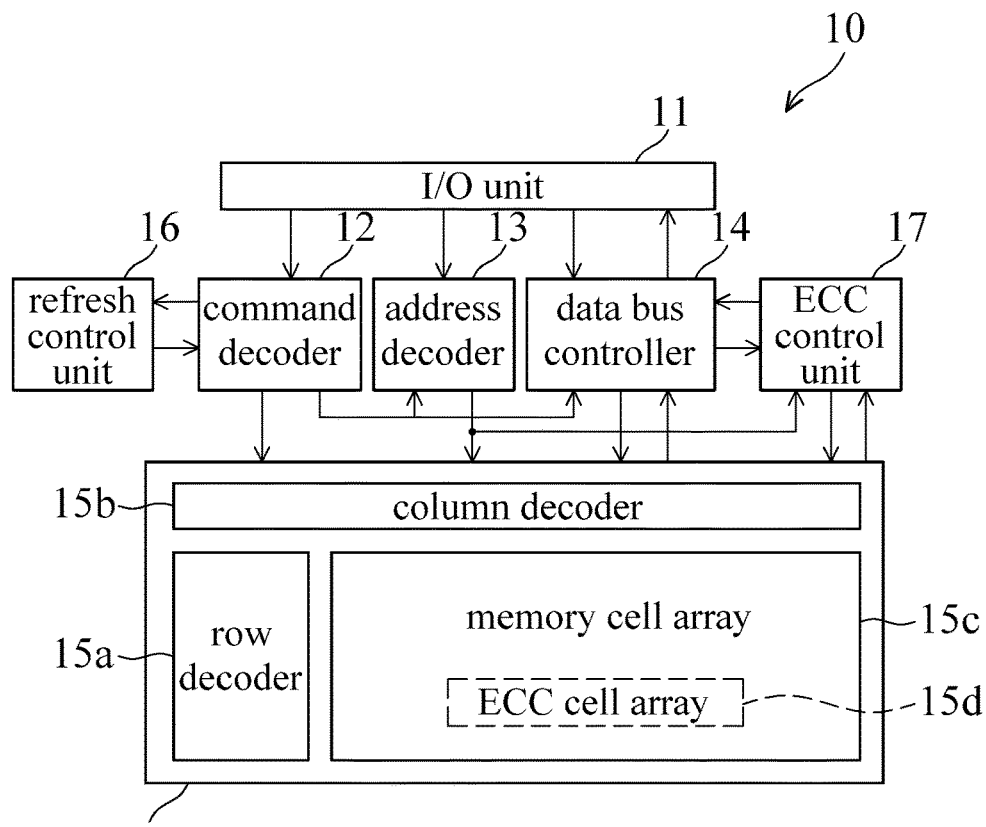
FIG. 8 is a diagram showing a configuration example of a semiconductor memory device according to a second embodiment of the present invention.

As shown in FIG. 8, the ECC cell array 15d is provided in the memory cell array 15c. As described in the first embodiment, since the ECC cell array 15d can be configured in the same manner as the memory cell array 15c, the ECC cell array 15d can be included in the memory cell array 15c.

Figure 9:
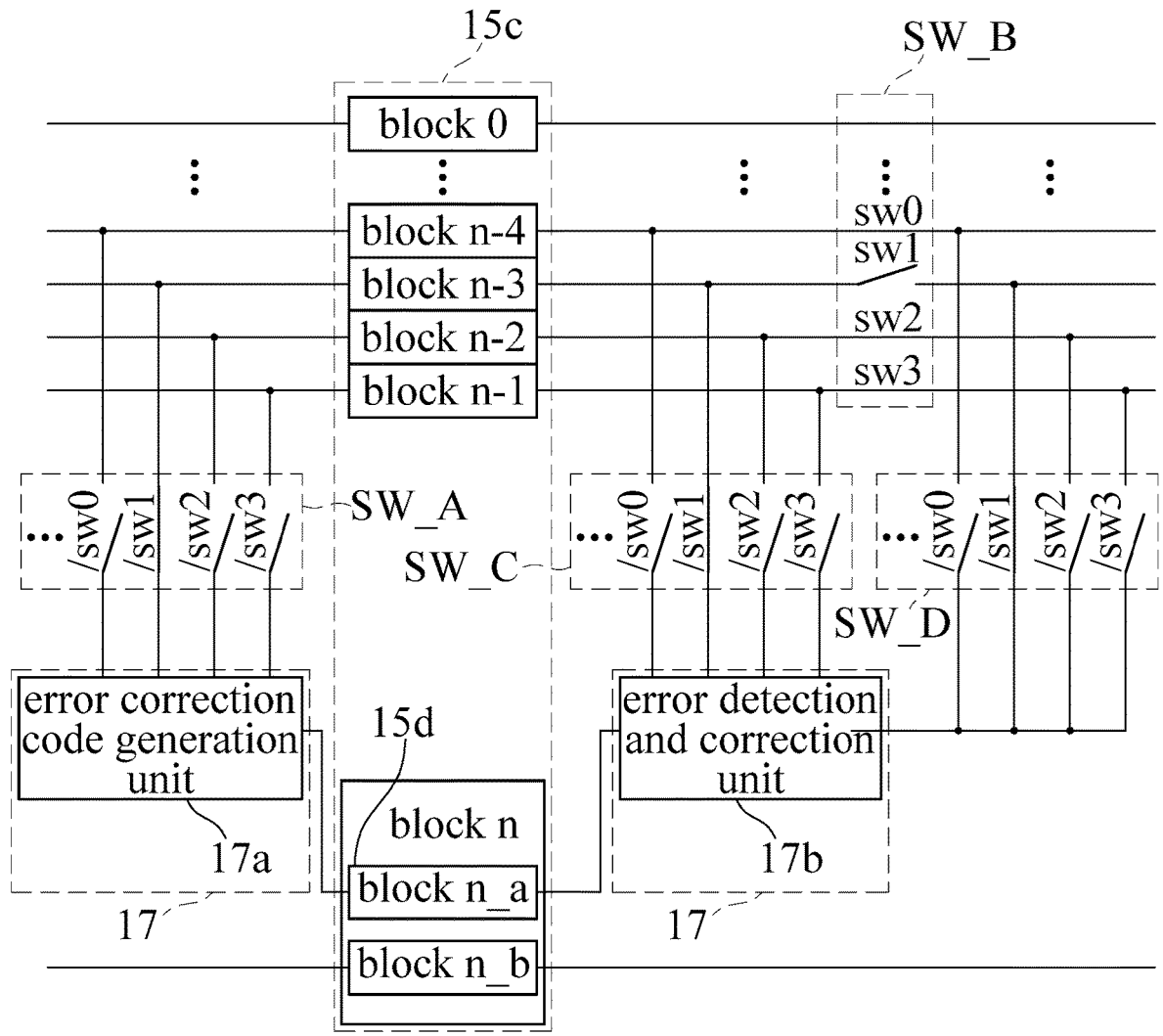
FIG. 9 is a diagram illustrating a configuration example of a semiconductor memory device.

Referring to FIG. 9, an example of data control in the semiconductor memory device 10 of the present embodiment is described. In this embodiment, as shown in FIG. 9, among a plurality of blocks in the memory cell array 15c (which are block 0, . . . , Block n−4, block n−3, block n−2, block n−1 in this example), sub-block n_a in another block (which is block n in this example) different from the selected block (which is block n−3 in this example) is configured as the ECC cell array 15d. Furthermore, when the memory capacity of the block n is larger than that of the ECC cell array 15d, a sub-block (which is sub-block n_b in this example) other than the sub-block for the ECC cell array 15d (sub-block n_a) in the block n can be configured to be the same as the other blocks which is a memory area for data in the memory cell array 15c. The control method of each switch unit SW_A, SW_B, SW_C, SW_D in this embodiment is the same as that of the first embodiment described above.

In the present embodiment, the ECC control unit 17 may automatically select a block from a plurality of blocks in the memory cell array 15c to be a block of the ECC cell array 15d. For example, the ECC control unit 17 may select a block in which no data is stored for a predetermined period from a plurality of blocks in the memory cell array 15c as a block of the ECC cell array 15d, and arrange the ECC cell array 15d in the selected block.

Furthermore, when the predetermined condition for arranging the ECC cell array 15d in the memory cell array 15c is not satisfied (for example, no block is frequently accessed within a specified period), the ECC cell array 15d in the memory cell array 15c can be configured to be a memory area for data but not a memory area for inspection data. In this case, all the blocks in the memory cell array 15c can be used as a memory area for storing data (which means that no ECC cell array 15d is configured).

As described above, the area (predetermined memory area) in which the inspection data is stored is configured to be another block (block n herein) different from the block selected from the plurality of blocks in the memory cell array 15c (block n−3 herein). As a result, the inspection data in the error correction code can be stored in the same memory cell array as the memory cell array 15c in which the data is stored. Therefore, it is possible to suppress the increase in circuit scale.

Hereinafter, a third embodiment of the present invention will be described. The semiconductor memory device 10 in this embodiment is different from each of the above-described embodiments in that a 2-transistor 2-capacitor (2T2C) cell array 15e is provided. Hereinafter, the configuration different from each of the above embodiments will be described.

As shown in FIG. 10, the semiconductor memory device 10 is provided with a 2T2C cell array 15e instead of the ECC cell array 15d in each of the above embodiments, and is provided with the 2T2C control unit 18 instead of the ECC control unit 17 in each of the above embodiments. Furthermore, the 2T2C control unit 18 may be configured by a dedicated hardware device or a logic circuit.

The 2T2C cell array 15e includes a plurality of memory cells (not shown in the figure) arranged in an array (matrix) form. Data input from the outside via the I/O unit 11 is stored in each memory cell. Each memory cell may be a well-known 2T2C (2-transistor 2-capacitor) type memory cell. Since the details of data control for each memory cell are the same as those of a well-known technique, the description thereof will be omitted in the present embodiment.

The 2T2C control unit 18 stores the data output from the data bus controller 14 to the memory cell array 15c in the 2T2C cell array 15e. Furthermore, the 2T2C control unit 18 outputs the data stored in the 2T2C cell array 15e to the data bus controller 14 when the data is output (read) from the memory cell array 15c.

Furthermore, the 2T2C control unit 18 is configured to select one of the plurality of blocks when the memory cell array including the plurality of 2T2C type memory cells arranged in the form of an array is divided into a plurality of blocks. Furthermore, the 2T2C control unit 18 is configured to store data, which is stored in a plurality of memory cells in the selected block, in a 2T2C cell array 15e composed of 2T2C type memory cells. The 2T2C control unit 18 is an example of the "second control unit" in the present invention.

Furthermore, the 2T2C control unit 18 blocks may select any one of a plurality of blocks based on the information related to the selected block included in the register write command each time when the register write command (predetermined command) including the second configuration register information (as shown in FIG. 11) is input from the outside. As a result, when a register write command (predetermined command) is input from the outside, one of a plurality of blocks is selected based on the information about the selected block included in the command. By transmitting the command from the external device (such as the memory controller and so on) to the semiconductor memory device 10, any block (a block in which data stored in the 2T2C cell array 15e is input herein) among the plurality of blocks can be set (selected) from the outside.

Here, when any block is selected based on the information about the selected block included in the register write command, and when the command decoder 12 receives a register write command (predetermined command) including the second configuration register information from an external device via the I/O unit 11, the second configuration register information is stored in the second configuration register (not shown in the figure). Furthermore, the command decoder 12 outputs a register write command to the 2T2C control unit 18 when a register write command including the second configuration register information is input.

Referring to FIG. 11, a configuration example of the second configuration register in the present embodiment is described. FIG. 5 shows, as an example of the second configuration register (CR1) of the pSRAM using the HyperBus™ interface. As shown in FIG. 11, the second configuration register is configured to be able to assign a function (which is "2T2C application block control" in this example) within a predetermined number of bits (16 bits in this example).

In the present embodiment, bits 11 to 9 of the second configuration register is configured to assign (select) the 2T2C application block (which is the block in which the data stored in the 2T2C cell array 15e is input). In the example shown in FIG. 11, one of a plurality of blocks (four in this example) is selected depending on the value of bits 11 to 9 of the second configuration register. The configuration of the second configuration register shown in FIG. 11 is the same as the configuration shown in FIG. 5, except that the function is changed from the "ECC application control block" to the "2T2C control block".

For example, the contents of the second configuration register shown in FIG. 11 can be written to the second configuration register in the semiconductor memory device 10 by inputting a register write command including the second configuration register information from an external device when the power of the semiconductor memory device 10 is turned on. Furthermore, the register write command including the second configuration register information may be input at an arbitrary timing while the power is turned on to the semiconductor memory device 10.

Figure 12:
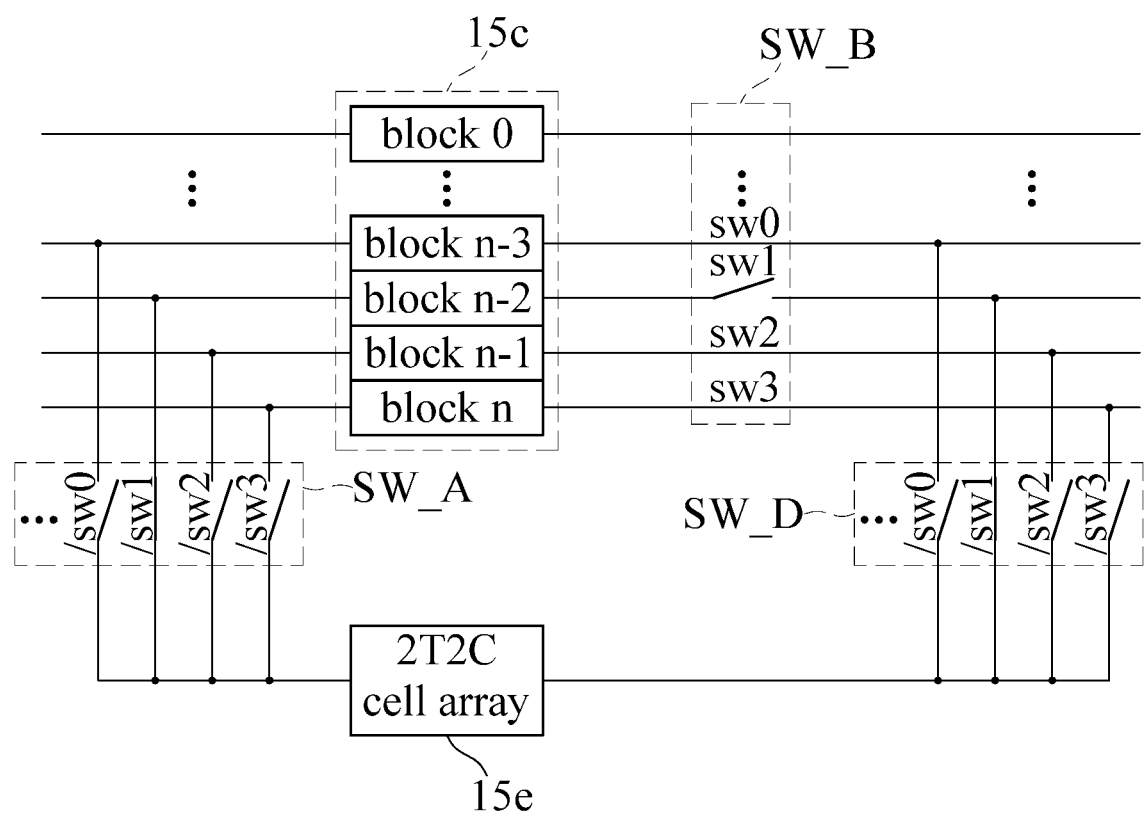
FIG. 12 is a diagram illustrating an example of data control in the semiconductor memory device of the present embodiment.

Referring to FIG. 12, except that the 2T2C control unit 18 and the 2T2C cell array 15e are provided instead of the ECC control unit 17 and the ECC cell array 15d, it is the same as the first embodiment. Like the first embodiment, the memory cell array 15c is divided into a plurality of blocks (which are blocks 0, . . . , Block n−3, block n−2, block n−1, block n in this example) in the present embodiment. In addition, the memory capacity of the 2T2C cell array 15e may be the same as the memory capacity of each block. For example, when the memory capacity of each block in the memory cell array 15c is 2M bits, the memory capacity of the 2T2C cell array 15e is 2M bits.

First, a case where data is stored in the memory cell array 15c will be described. The data output from the data bus controller 14 is input (stored) to the input side of each block of the memory cell array 15c. Furthermore, the data input to the selected block (block n−2 in this example) among each blocks is also input to the 2T2C control unit 18 via the switch unit SW_A.

Here, the 2T2C control unit 18 may select a block (block n−2 herein) based on the information related to the selected block included in the register write command like the ECC control unit 17 in each of the above embodiments. Furthermore, when the data is input to the selected block (block n−2 herein) among each block, 2T2C control unit 18 also controls the switch unit SW_A to input (store) the data to the 2T2C cell array 15e.

For example, like the ECC control unit 17 in each of the above embodiments, the 2T2C control unit 18 controls the switch/sw1 of the switch unit SW_A to be turned on and switches/sw0, /sw2, and/sw3 of the switch unit SW_A to be turned off. As a result, the data input to the block n−2 of the memory cell array 15c is also input to the 2T2C cell array 15e via the switch unit SW_A.

Next, a case where data is output from the memory cell array 15c will be described. Data output from blocks other than the block selected among each block of the memory cell array 15c is input to the data bus controller 14 via the switch unit SW_B. On the other hand, the data output from the selected block (which is block n−2 herein) among the blocks is not input to the data bus controller 14 via the switch unit SW_B. Instead, the 2T2C control unit 18 outputs the data stored in the 2T2C cell array 15e to the data bus controller 14 via the switch unit SW_D. Here, the 2T2C control unit 18 controls the switch units SW_B and SW_D to input the data stored in the 2T2C cell array 15e to the data bus controller 14 as data output from the selected block (block n−2 herein) among the blocks.

For example, the 2T2C control unit 18 controls the switches sw0, sw2, and sw3 of the switch unit SW_B to be turned on, and controls the switch sw1 of the switch unit SW_B to be turned off. Furthermore, the 2T2C control unit 18 controls the switch/sw1 of the switch unit SW_D to be turned on, and controls the switches/sw0, /sw2, and/sw3 to be turned off. As a result, the data output from the 2T2C cell array 15e is input to the data bus controller 14 via the switch unit SW_D.

In this way, we can only store the data, which is stored in the selected block (block n−2) among the plurality of blocks in the memory cell array 15c, in the 2T2C memory cell that has higher data retention characteristics than the 1T1C type memory cell, and output the data from the 2T2C type cell array at the same time.

Although providing the 2T2C cell array 15e and the 2T2C control unit 18 instead of the ECC cell array 15d and the ECC control unit 17 is described as an, the above components may all be configured in the semiconductor memory device 10.

As described above, according to the semiconductor memory device 10 of the present embodiment, it is possible to improve the retention characteristics of the data stored in the selected block since only the data stored in the selected block among the plurality of blocks in the memory cell array 15c is stored in the 2T2C type memory cell. Furthermore, in the present embodiment, it is not necessary that all of the memory cells in the memory cell array 15c are configured to be 2T2C type. Therefore, compared with cases where all of the memory cells in the memory cell array 15c are configured to be 2T2C type, it is possible to suppress an increase in the circuit scale according to the semiconductor memory device 10 of the present embodiment.

Each of the embodiments described above is described for facilitating the understanding of the present invention, and is not described for limiting the present invention. Therefore, each element disclosed in each of the above embodiments is intended to include all design changes and equivalents within the technical scope of the present invention.

For example, although cases where selecting one of the blocks in the memory cell array 15c has been described as an example in each of the embodiments described above, the present invention is not limited to such cases. For example, we can also select two or more blocks from a plurality of blocks and store the data from the selected blocks in the ECC cell array 15d and/or the 2T2C cell array 15e.

Furthermore, in each of the embodiments described above, although cases where information related to the refresh interval and information related to the selected block are included in the register write command have been provided as examples, the present invention is not limited to such cases. For example, information related to the refresh interval and/or information related to the selected block may be included in other commands (for example, read command, write command, and so on).

Furthermore, the embodiments described above are cases where the ECC control unit 17 and the 2T2C control unit 18 selects one of a plurality of blocks based on the information related to the selected block included in the register write command. The present invention is not limited to such cases. For example, the ECC control unit 17 and/or the 2T2C control unit 18 may select a block from among a plurality of blocks that satisfies a predetermined condition. Here, the predetermined condition may be, for example, that the block has been accessed (read and/or written) most frequently within a predetermined time period. For example, when the most frequently accessed block within a predetermined period is selected, the ECC control unit 17 and/or the 2T2C control unit 18 can select a block in which data (for example, a global variable) that is intensively accessed within a predetermined period is stored. In this case, the ECC control unit 17 and/or the 2T2C control unit 18 can determine (or select) a block that has been accessed the most frequently within a predetermined period by counting the number of accesses for each of the blocks based on the row address signal output from the address decoder 13. In addition, the ECC control unit 17 and/or the 2T2C control unit 18 may perform block selection each time at the predetermined timings (for example, every time a predetermined period elapses, and so on). This makes it possible to appropriately change the selected block.

Furthermore, the configuration of each unit 11 to 18 in the semiconductor memory device 10 in each of the embodiments described above is an example, and may be appropriately changed or adopt other configurations.

What is claimed is:

1. A semiconductor memory device, comprising:
   a first control unit, setting the refresh interval of a memory cell based on information related to the refresh interval of the memory cell included in a predetermined command input from the outside;
   a first switch portion and a second switch portion, each having a plurality of switches; and
   a second control unit, selecting one block among a plurality blocks b controlling the first switch portion when a memory cell army including a plurality of memory cells which are arranged in an array is divided into a plurality of blocks, and storing inspection data in an error correction code in a predetermined memory area, wherein the inspection data is generated for the data stored in the plurality of memory cells in the selected block;
   wherein the second control unit controls the second switch portion to couple the selected block to the second control unit, thereby performing error detection and correction when the data is output from the selected block.

2. The semiconductor memory device as claimed in claim 1, wherein the predetermined command is a command for setting a function of the semiconductor memory device.

3. The semiconductor memory device as claimed in claim 1, wherein the first control unit sets the refresh interval of the memory cell based on information related to the refresh interval of the memory cell included in a predetermined command each time the predetermined command is input from the outside.

4. The semiconductor memory device as claimed in claim 2, wherein the first control unit sets the refresh interval of the memory cell based on information related to the refresh interval of the memory cell included in a predetermined command each time the predetermined command is input from the outside.

5. The semiconductor memory device as claimed in claim 1, wherein the second control unit selects one block among the plurality of blocks based on information related to the selected block included in the predetermined command input from the outside.

6. The semiconductor memory device as claimed in claim 1, wherein the predetermined memory area is set up in another memory cell array that is different from the memory cell array mentioned above.

7. The semiconductor memory device as claimed in claim 1, wherein the predetermined memory area is set up in another block that is different from the block selected from among the plurality of blocks.

8. The semiconductor memory device as claimed in claim 1, wherein
the second control unit, selecting one block among a plurality of blocks when a memory cell array including a plurality of one-transistor one-capacitor (1T1C) memory cells which are arranged in an array is divided into the plurality of blocks, and storing the data, which is stored in the plurality of memory cells in the selected block, in a predetermined memory area composed of two-transistor two-capacitor (2T2C) memory cells.

9. The semiconductor memory device as claimed in claim 2, wherein
the second control unit, selecting one block among a plurality of blocks when a memory cell array including a plurality of one-transistor one-capacitor (1T1C) memory cells which are arranged in an array is divided into the plurality of blocks, and storing the data, which is stored in the plurality of memory cells in the selected block, in a predetermined memory area composed of two-transistor two-capacitor (2T2C) memory cells.

10. The semiconductor memory device as claimed in claim 3, wherein
the second control unit, selecting one block among a plurality of blocks when a memory cell array including a plurality of one-transistor one-capacitor (1T1C) memory cells which are arranged in an array is divided into the plurality of blocks, and storing the data, which is stored in the plurality of memory cells in the selected block, in a predetermined memory area composed of two-transistor two-capacitor (2T2C) memory cells.

11. The semiconductor memory device as claimed in claim 8, wherein the second control unit selects one block among the plurality of blocks based on information related to the selected block included in the predetermined command input from the outside.

* * * * *